United States Patent
Kato et al.

(10) Patent No.: US 8,384,657 B2
(45) Date of Patent: Feb. 26, 2013

(54) SEMICONDUCTOR DEVICE

(75) Inventors: Kiyoshi Kato, Sagamihara (JP);
Toshihiko Saito, Atsugi (JP)

(73) Assignee: Semicondcutor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/367,634

(22) Filed: Feb. 7, 2012

(65) Prior Publication Data

US 2012/0139872 A1    Jun. 7, 2012

Related U.S. Application Data

(60) Continuation of application No. 12/426,976, filed on Apr. 21, 2009, now Pat. No. 8,130,191, which is a division of application No. 10/793,822, filed on Mar. 8, 2004, now Pat. No. 7,583,250.

(30) Foreign Application Priority Data

Mar. 12, 2003  (JP) .................................. 2003-067275

(51) Int. Cl.
*G09G 3/36*     (2006.01)
(52) U.S. Cl. ............................. 345/104; 345/92; 345/93
(58) Field of Classification Search ............ 345/87–104, 345/204–215
See application file for complete search history.

(56) References Cited

U.S. PATENT DOCUMENTS

| | | | |
|---|---|---|---|
| 4,393,380 A | 7/1983 | Hosokawa et al. | |
| 5,191,322 A * | 3/1993 | Katayama et al. | 345/92 |
| 5,369,228 A | 11/1994 | Faust | |
| 5,369,512 A * | 11/1994 | Yanai et al. | 349/38 |
| 5,909,262 A | 6/1999 | Tomooka et al. | |
| 6,396,471 B1 | 5/2002 | Hirakata | |
| 6,597,348 B1 | 7/2003 | Yamazaki et al. | |
| 6,628,263 B1 | 9/2003 | Konuma et al. | |
| 6,638,781 B1 | 10/2003 | Hirakata et al. | |
| 6,747,290 B2 | 6/2004 | Yamazaki et al. | |
| 6,888,602 B2 | 5/2005 | Takeda et al. | |
| 6,909,589 B2 | 6/2005 | Huff | |
| 6,972,753 B1 | 12/2005 | Kimura et al. | |
| 7,583,250 B2 | 9/2009 | Kato et al. | |

FOREIGN PATENT DOCUMENTS

| | | |
|---|---|---|
| JP | 07-333576 | 12/1995 |
| JP | 2000-172437 | 6/2000 |
| JP | 2001-255986 | 9/2001 |

* cited by examiner

*Primary Examiner* — Vijay Shankar
(74) *Attorney, Agent, or Firm* — Eric J. Robinson; Robinson Intellectual Property Law Office, P.C.

(57) ABSTRACT

A variable capacitor is formed from a pair of electrodes and a dielectric interposed between the electrodes over a substrate, and an external input is detected by changing capacitance of the variable capacitor by a physical or electrical force. Specifically, a variable capacitor and a sense amplifier are provided over the same substrate, and the sense amplifier reads the change of capacitance of the variable capacitor and transmits a signal in accordance with the input to a control circuit.

14 Claims, 17 Drawing Sheets

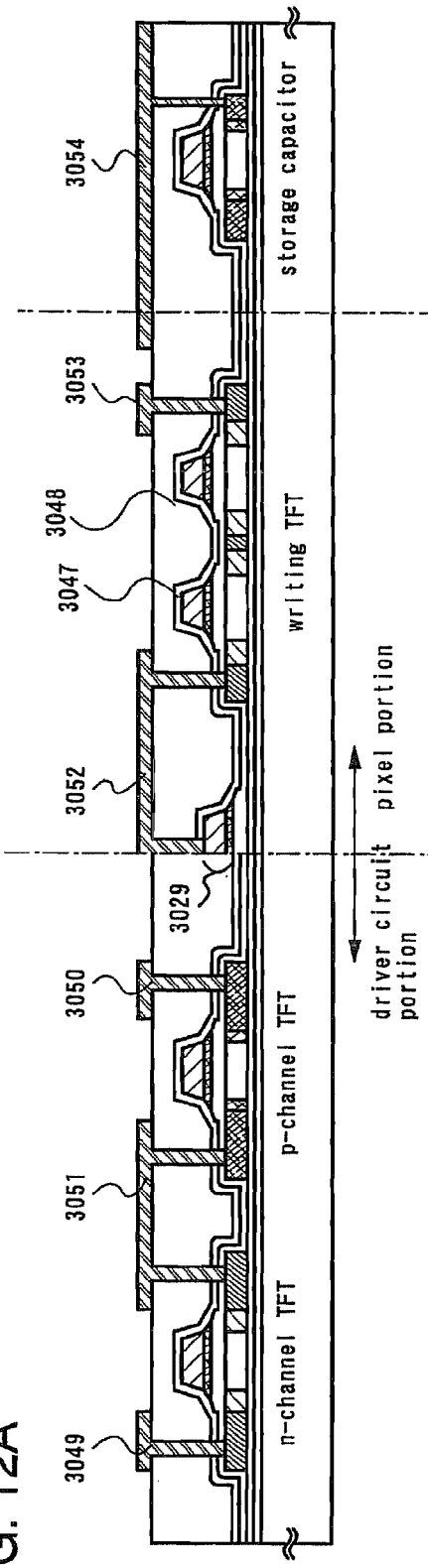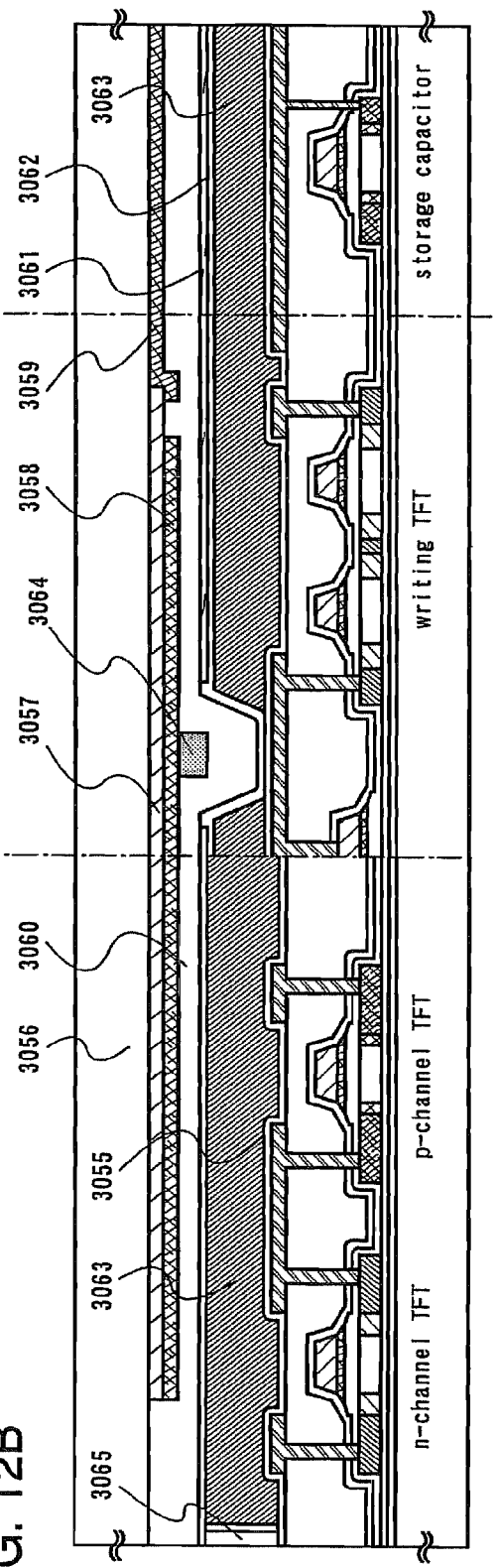

SEMICONDUCTOR DEVICE

BACKGROUND OF THE INVENTION

1. Field of Invention

The present invention relates to a semiconductor device in which a display device and a control circuit are provided over an insulating substrate. In particular, the present invention relates to a display device including a thin film transistor (hereinafter referred to as a TFT) over an insulating substrate such as a glass substrate, or a plastic substrate and a semiconductor device including a control circuit.

2. Related Art

In late years, expectations for a so-called "system on panel" in which a driver circuit and a control circuit as well as a display device such as a liquid crystal display device are integrally formed over an insulating substrate such as a glass substrate or a plastic substrate are increased. The control circuit here refers to a CPU, a memory, a controller, and the like.

Using such a "system on panel", weight saving, cost reduction, miniaturization, lower power consumption, and improvements in reliability of a semiconductor device are expected.

When an external input unit is used for such a system on panel, a connector of the input unit can obstruct miniaturization and can also be a major factor of the bottleneck of the reliability. Accordingly, by arranging the input unit including a keyboard in the same substrate, such a system on panel can be more sophisticated.

As for an existing semiconductor device, input operation is performed by pushing or touching a button-like input unit with a finger or the like.

For example, a liquid crystal display device often uses glass for a counter substrate. When an input unit is to be integrated on the glass substrate, it is desirable to form buttons from glass directly on the substrate; however, that is not easy due to the nature of the material.

Further, when plastic is employed for the counter substrate, the number of steps is increased by forming the button into the liquid crystal display device; therefore, reduction in yield or reduced reliability can be caused.

SUMMARY OF THE INVENTION

The present invention is made in view of the above problems. It is an object of the present invention to provide a semiconductor device at a lower price, in which the input operation can be performed without employing an external input unit.

The following measures are taken in the present invention to solve the problems of the above-mentioned related art.

As shown in FIG. 3A, an input circuit is formed on a substrate 301, including a variable capacitor 307 which is formed from a first electrode 305 on a substrate 301, a second electrode 304 on a counter substrate 302 and a dielectric 306, and a circuit that senses the change of the capacitance of the variable capacitor 307 as an external input is formed on the substrate 301.

When the dielectric 306 is transformed by pushing the counter substrate 302 as shown in FIG. 3B, the capacitance of the variable capacitor 307 changes. The change of the capacitance is read by a sense amplifier 303 formed over the substrate 301.

When the sensibility of the sense amplifier 303 is high enough, the change of capacitance of the variable capacitor 307 which is caused by input operation can be sensed as input even if the change is little.

By using the a structure as described above, a semiconductor device including: an insulating substrate; a pair of electrodes sandwiching a dielectric; a variable capacitor including the pair of electrodes and the dielectric, which is formed over the insulating substrate; and a display device over the insulating film, wherein the semiconductor device includes a means for converting change of capacitance of the variable capacitor into an electrical signal can be obtained.

Further, a semiconductor device including: an insulating substrate; a pair of the electrodes sandwiching a dielectric; a plurality of variable capacitors each including the pair of electrodes and the dielectric, which are formed over the insulating substrate; and a display device over the insulating film, wherein the semiconductor device includes a means for converting change of capacitance of each variable capacitor into an electrical signal can be obtained.

Further, a semiconductor device including: an insulating substrate; a variable capacitor including a pair of electrodes and a dielectric interposed therebetween; a read-out circuit that detects change of capacitance of the variable capacitor; and a display device, wherein the variable capacitor, the control circuit, and the display device are provided over the insulating substrate can be obtained.

Further, a semiconductor device including: an insulating substrate; a plurality of variable capacitors each including a pair of electrodes and a dielectric interposed therebetween; a read-out circuit that detects change of capacitance of each variable capacitor; and a display device, wherein the variable capacitors, the control circuit, and the display device are provided over the insulating substrate can be obtained.

Further, the semiconductor device above includes a dielectric that is formed from a material that can be transformed under external pressure.

Further, the semiconductor device described above includes a display device and the input circuit, which comprise a thin film transistor formed over the insulating substrate.

Further, the semiconductor device above includes a dielectric that is surrounded by the pair of electrodes and a sealant, and the dielectric is formed of liquid crystal that is used for the display device.

Further, the semiconductor device above includes an insulating substrate that is formed of glass or plastic.

Further, the semiconductor device above includes a second electrode that is formed over a glass substrate or a plastic substrate.

Further, the semiconductor device above includes a variable capacitor that is arranged in a line, in a grid, or in a random order.

Further, change of capacitance of the variable capacitor in the semiconductor device above is generated by applying a physical force or by using an electrical signal.

Thus, a game machine, a video camera, of a head-mounted display, a DVD player, a personal computer, a cellular phone, a car audio, and a card viewer each of which uses the semiconductor device above can be obtained.

According to the invention, an external input circuit, arithmetic and control circuits, a driver circuit, and a display part can be formed integrally on glass without increasing the number of the steps compared with an existing technique, and a "system on panel" on glass can be operated without using an external input unit. Thus, the invention is contributed to the miniaturization of a device and improvements in the reliability of operation.

Further, liquid crystal used for external input detection can be the same liquid crystal used for a display panel, and an electrode can also use the same electrode of the display portion. Therefore, at once the display portion can be formed can be formed and the part used for external input detection. Thus, simplification of the manufacturing process, reduction in area, and improvements in yield can be conducted.

BRIEF DESCRIPTION OF THE DRAWING

FIGS. 12A and 12B show an example of steps for forming a TFT according to the present invention.

DETAILED DESCRIPTION OF THE PREFERRED EMBODIMENTS

Embodiment Mode

Figure 1A:
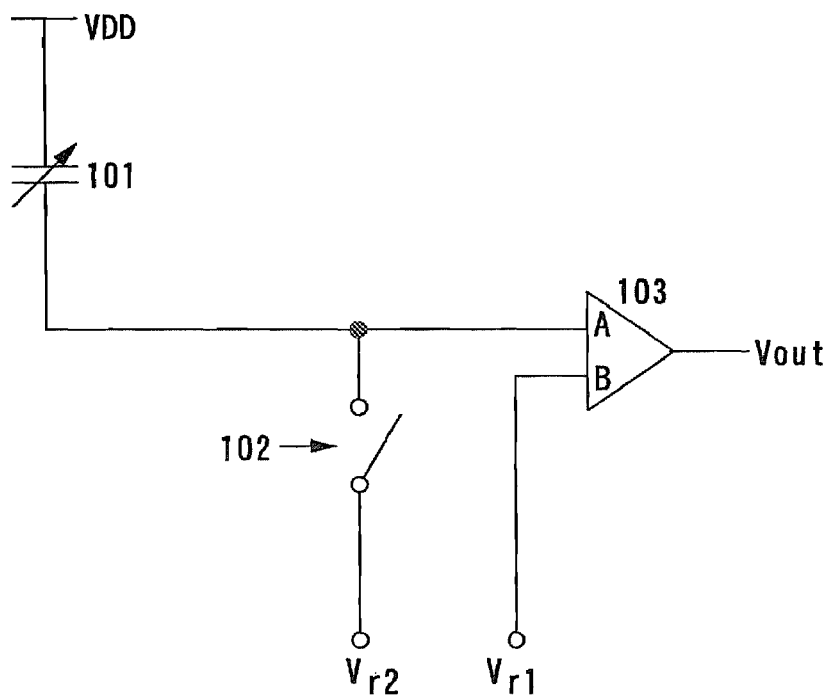
FIGS. 1A and 1B show an embodiment of the present invention.
Figure 1B:
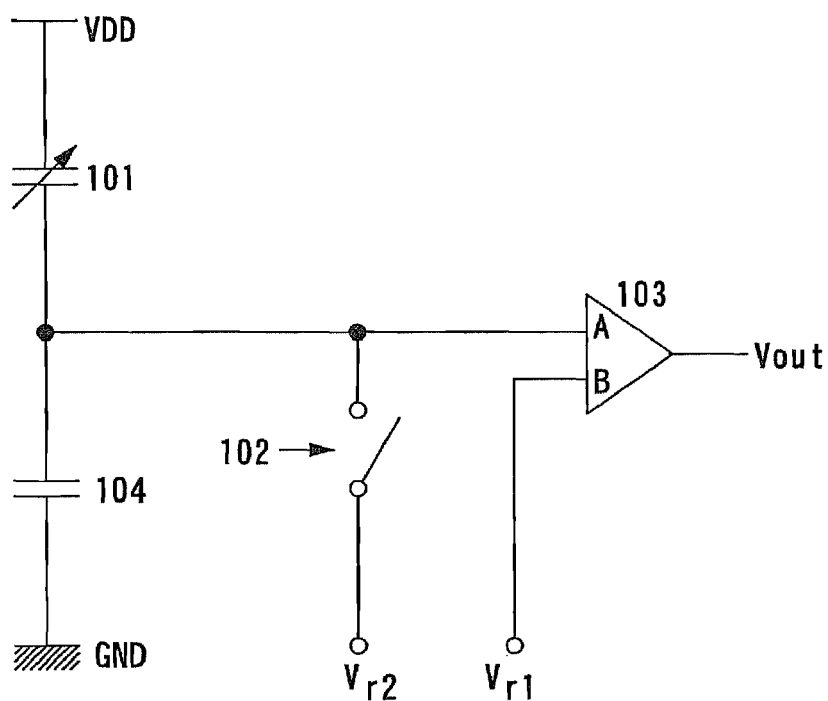

The embodiment mode of the present invention is explained with reference to FIGS. 1A and 1B. FIGS. 1A and 1B show schematic diagrams of an input circuit. An example of converting input information of pressure change caused by a touch with a finger to an electrical signal will be explained in this embodiment mode. All such circuits are configured on an insulating substrate.

The operation of the input circuit will be explained with reference to FIG. 1A. In FIG. 1A, reference numeral 101 denotes a variable capacitor and is composed of a dielectric and electrodes sandwiching the dielectric. Reference numeral 102 denotes a reset switch and 103 denotes a sense amplifier. VDD is applied to the electrode of input side of the variable capacitor 101.

The detection of input information by the sense amplifier 103 is performed as follows. First, the reset switch 102 is turned off. When capacitance of the variable capacitor 101 changes according to the change of input information, the voltage applied to a terminal A of the sense amplifier 103 changes as well. Output is determined by the potential difference between the changed voltage and a reference voltage Vr1 applied to a terminal B of the sense amplifier 103.

Resetting is operated before detecting input information so as to operate the sense amplifier 103 stably. That turns the reset switch 102 on, and Vr2 is applied to the terminal A of the sense amplifier 103.

Further, even when input information is not detected, resetting operation is performed appropriately. This is because voltage of the terminal A of the floating sense amplifier 103 changes gradually by the force of leak current.

Figure 2:
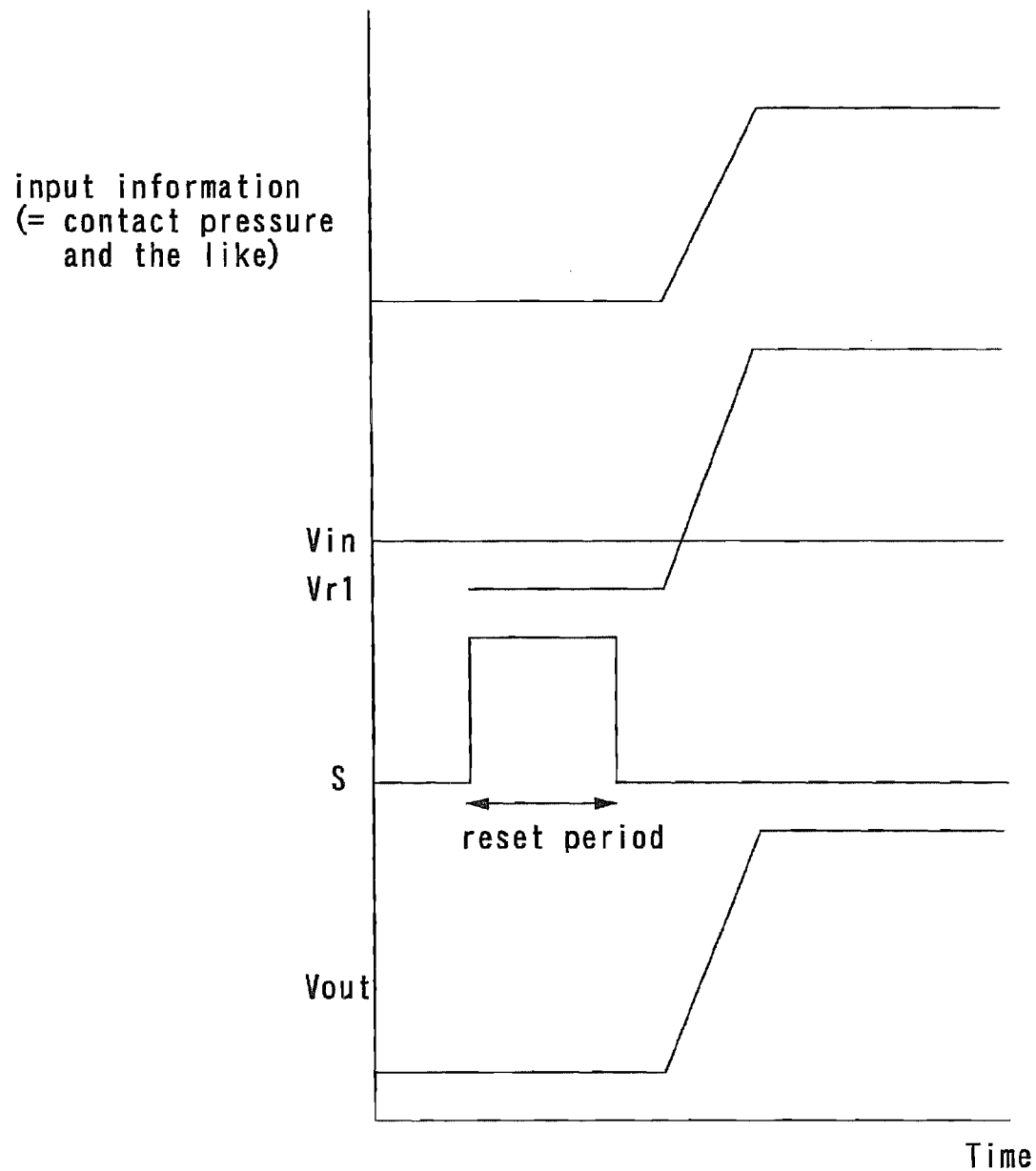
FIG. 2 shows an example of change of output with respect to input over time.
Figure 3A:
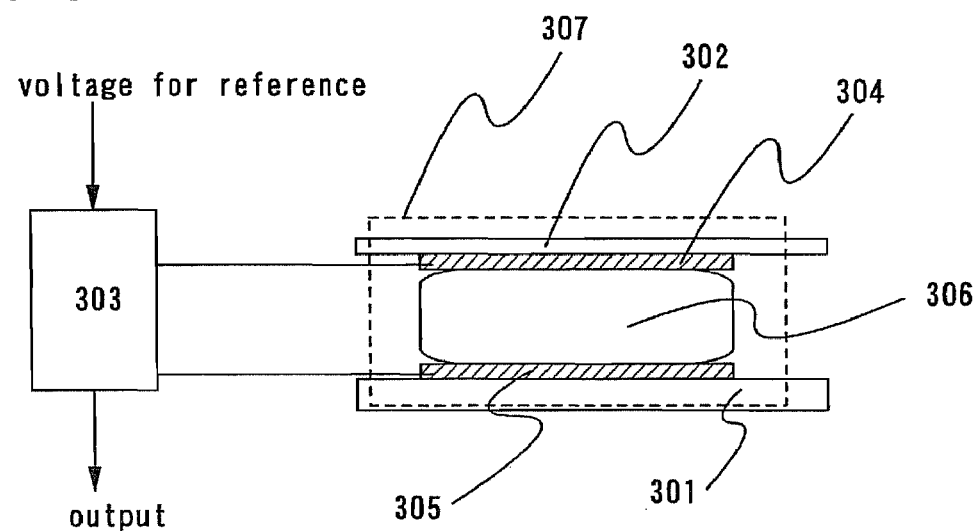
FIGS. 3A and 3B show steps for resolving a problem.
Figure 3B:
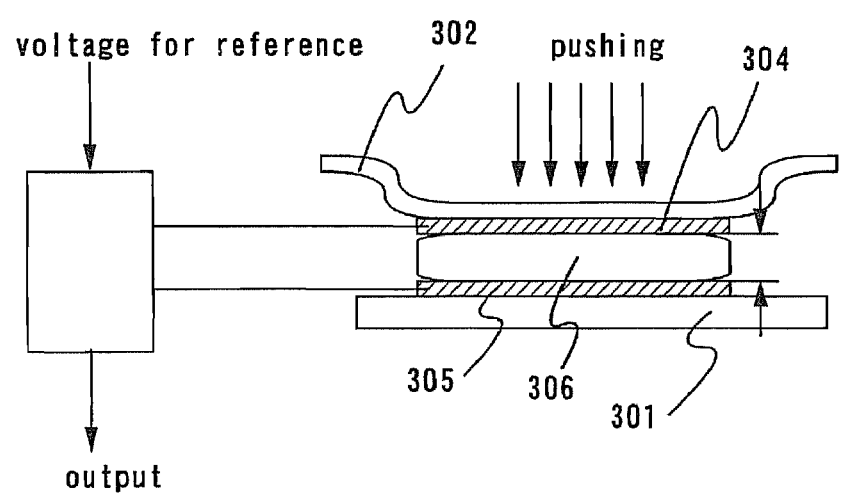

An example of change of output in relation to such detection of input information with time is shown in FIG. 2.

Further, a capacitor 104 that is grounded may additionally be connected to the terminal A of the sense amplifier 103 as shown in FIG. 1B. More stable operation can be conducted desirably by using such configuration.

Note that, a circuit connected to the input side of the sense amplifier 103 may use any structure in which the capacitance of the variable capacitor 103 changes in accordance with the input from outside.

Hereinafter, embodiments of the present invention will be described.

Embodiment 1

In this embodiment, a display device using an input circuit as described in the embodiment mode will be explained with reference to FIG. 4.

Figure 4:
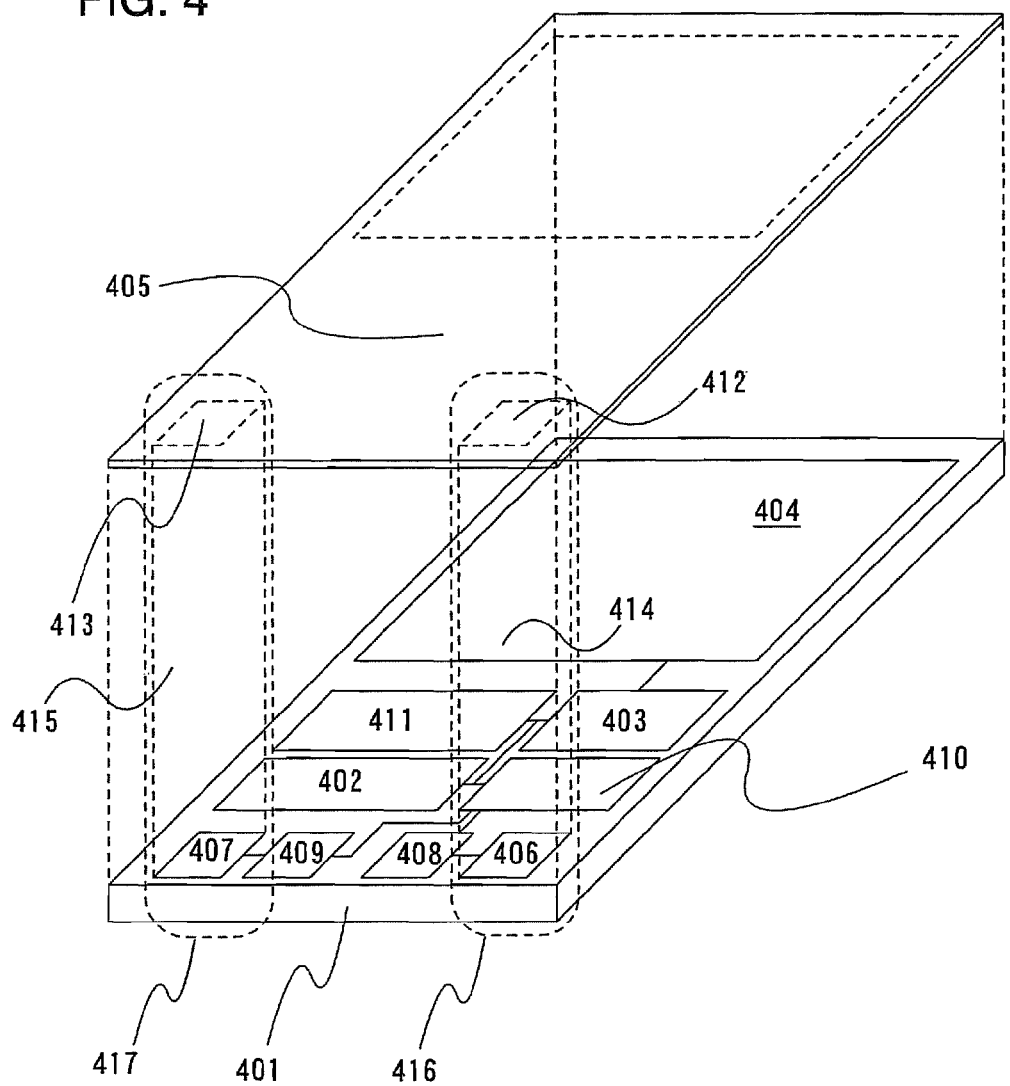
FIG. 4 is the figure which shows an embodiment of the present invention.

In FIG. 4, a CPU 402, an image processing circuit 403, a display portion 404, first electrodes 406 and 407, second electrodes 412 and 413, and read-out circuits 408 and 409 are integrally formed on a substrate 401. Incidentally, variable capacitors 416 and 417 are configured by the first electrodes 406 and 407, the second electrodes 412 and 413, and dielectrics 414 and 415 interposed therebetween. Input operation is performed by putting pressure on the surface of a counter substrate 405.

When the variable capacitors 416 and 417 are under pressure through the counter substrate 405, the shapes of the dielectrics 414 the 415 change, and the capacitances of the variable capacitors 416 and 417 change correspondingly. The read-out circuit 408 or 409 reads the change of the capacitance, and control in response to the read result is performed by an interface circuit 411, the CPU 402, and the image processing circuit 403.

An insulating substrate made of glass, plastic, or another transparent and flexible material can be used for the counter substrate 405. It is particularly preferable to use a plastic substrate since it has high flexibility and can be processed easily.

The dielectrics 414 and 415 can use liquid crystal or other materials with high dielectric constant and flexibility. The same sealant for sealing the liquid crystal of the display part can be used to seal the dielectrics.

In this embodiment, an example with the two input areas is shown; however, the number can be decided freely. Further, the shape of the input area can also be decided freely.

Miniaturization, weight saving, and higher sophistication of a semiconductor device can be conducted by forming a display device as above.

Embodiment 2

Among display devices using input circuits explained in the embodiment mode, one having a structure which is different from Embodiment 1 will be described with reference to FIGS. 5A and 5B in this embodiment.

Figure 5A:
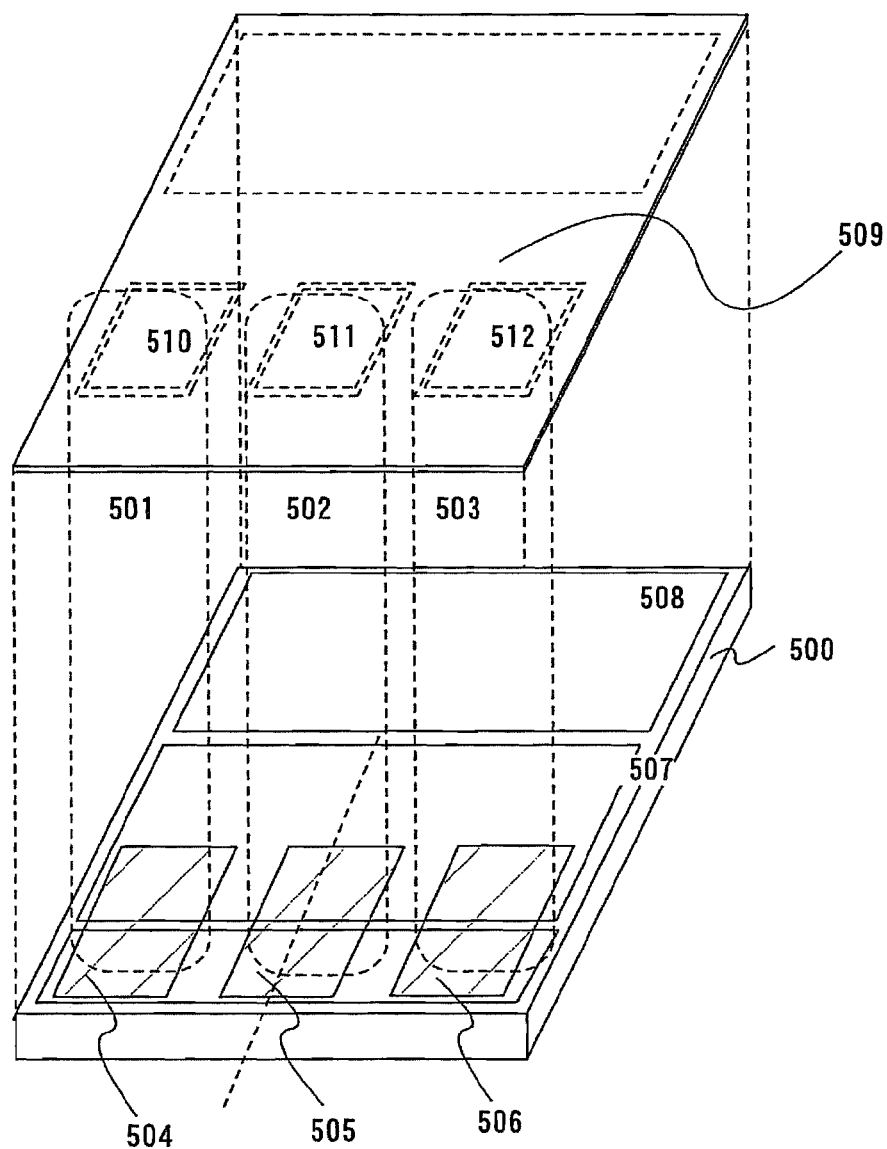
FIGS. 5A and 5B show an embodiment of the present invention.

In FIG. 5A, variable capacitors 501 to 503 including first and second electrodes and a dielectric interposed therebetween, read-out circuits 504 to 506, a CPU, a RAM, an image processing circuit, a controller circuit 507 configured with an interface circuit, and a display portion 508, are integrally formed on a substrate 500. Input operation is performed by putting pressure on the surface of a counter substrate, particularly on input units 510 to 512.

Figure 5B:
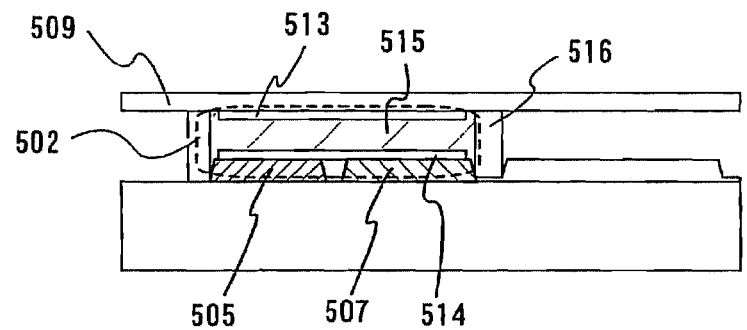

FIG. 5B is a cross-sectional view of a variable capacitor 502, the read-out circuit 505, and the controller circuit 507. The variable capacitor 502 is formed above the read-out circuit 505 and the controller circuit 507. The variable capacitor 502 includes a first electrode 513, a second electrode 514, and a dielectric 515 interposed therebetween. When a counter substrate 509 is pressurized, the shape of the dielectric 515 changes, and the capacitance of the variable capacitor 502 changes accordingly. The read-out circuit 505 reads the change of the capacitance, and control in response to the read result is performed by the controller circuit 507.

Glass, plastic, or a transparent insulating substrate with flexibility can be used for a material of the counter substrate 509. It is particularly preferable to use a plastic substrate since it has high flexibility and can be processed easily.

The dielectric 515 can use liquid crystal or another material with high dielectric constant and flexibility. The same sealant for sealing the liquid crystal of the display portion can be used for a sealant 516 to seal the dielectric.

In this embodiment, an example with the three input areas is shown; however, the number can be decided freely. Further, the shape of the input area can also be decided freely.

By forming a display device as above, the area of the input units in the surface of a semiconductor device is increased, and the convenience of input operation can be improved. Further, required area can be reduced by efficiently arranging the controller section and a read-out circuit; thus, miniaturization, weight saving, and higher sophistication of a semiconductor device can be aimed.

Embodiment 3

Among display devices using input circuits explained in the embodiment mode, one having a structure which is different from Embodiments 1 and 2 will be described with reference to FIG. 15 in this embodiment.

Figure 15:
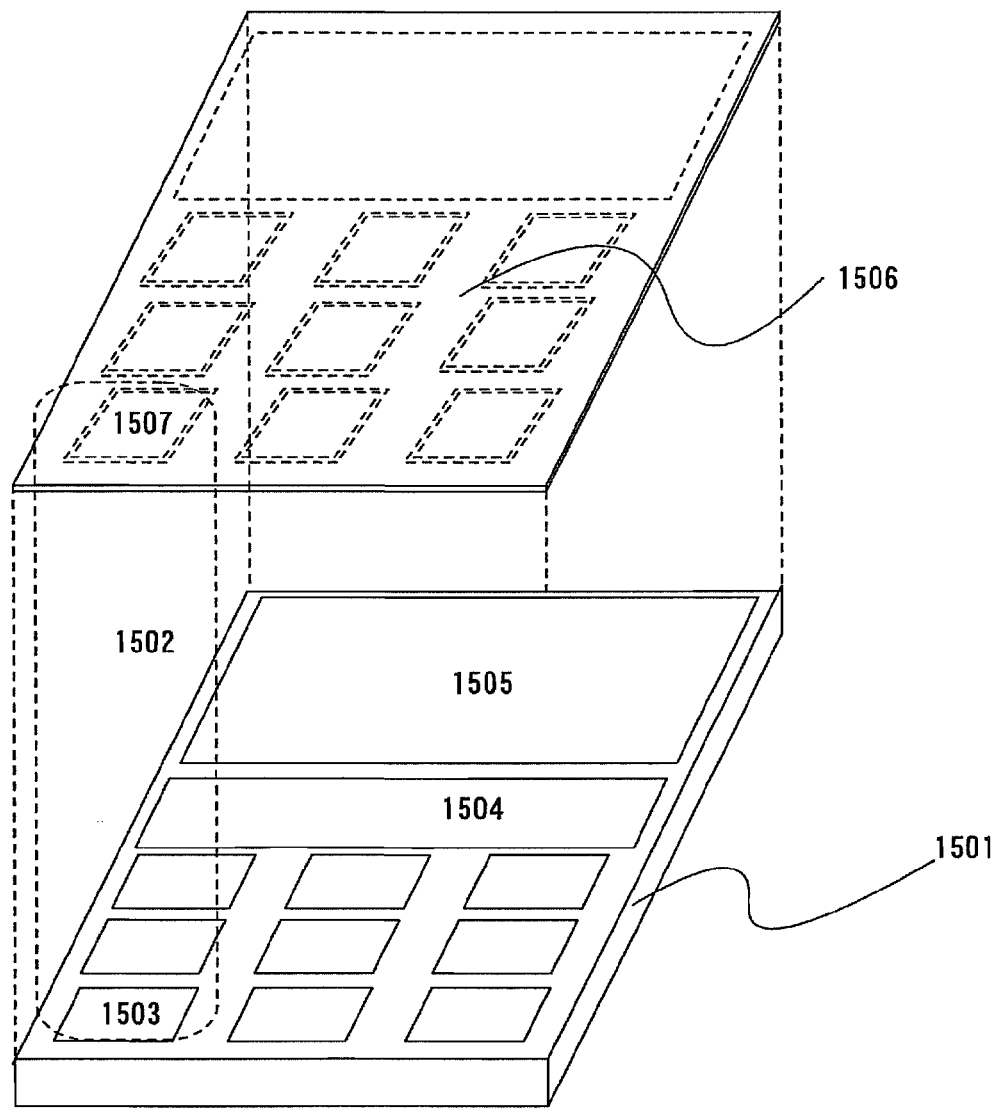
FIG. 15 shows an embodiment of the present invention.

In FIG. 15, a variable capacitor 1502 including a first electrode below an input region 1507, a second electrode 1503 and a dielectric interposed therebetween, and a read-out circuit (not shown) are respectively arranged in a grid over a substrate 1501. The variable capacitor, the read-out circuit, a controller circuit 1504 configured with a CPU, a RAM, an image processing circuit and an interface circuit, and a display portion 1505 are integrally formed over the substrate 1501.

When the variable capacitor 1502 is under pressure through the counter substrate 1506, the shape of the dielectric in the variable capacitor 1502 changes, and the capacitance of the variable capacitor 1502 changes accordingly. The read-out circuit reads the change of the capacitance, and control in response to the read result is performed by the controller circuit 1504.

An insulating substrate made of glass, plastic, or a transparent material with flexibility can be used for the counter substrate 1506. It is particularly preferable to use a plastic substrate since it has high flexibility and can be processed easily.

The dielectric in the variable capacitor 1502 can use liquid crystal or another material with high dielectric constant and flexibility. The same sealant for sealing the liquid crystal of the display part can be used to seal the dielectric.

In this embodiment, an example with the 9 input areas including the input unit 1507 over the counter substrate is shown; however, that is only an example, and the number and the shape of the input area are not limited thereto.

The arrangement of the variable capacitance 1502 and read-out circuit may be arranged in a grid, or in a random order. Further, the area of the input area of the respective variable capacitor can be determined freely.

The number of the input areas can be increased by forming a display device as above, and a display device having many input areas, for example, a keyboard, can be formed. Accordingly, higher sophistication of a semiconductor device can be achieved.

Embodiment 4

This embodiment gives a description on a method of manufacturing TFTs for driving circuits provided in a pixel area and in the periphery of the pixel potion formed on the same substrate with reference to FIGS. 10A to 12B. A method for manufacturing a liquid crystal display device is described as an example; however, the present invention is not limited to the above mentioned liquid crystal display device.

Figures 10A, 10B, 10C:
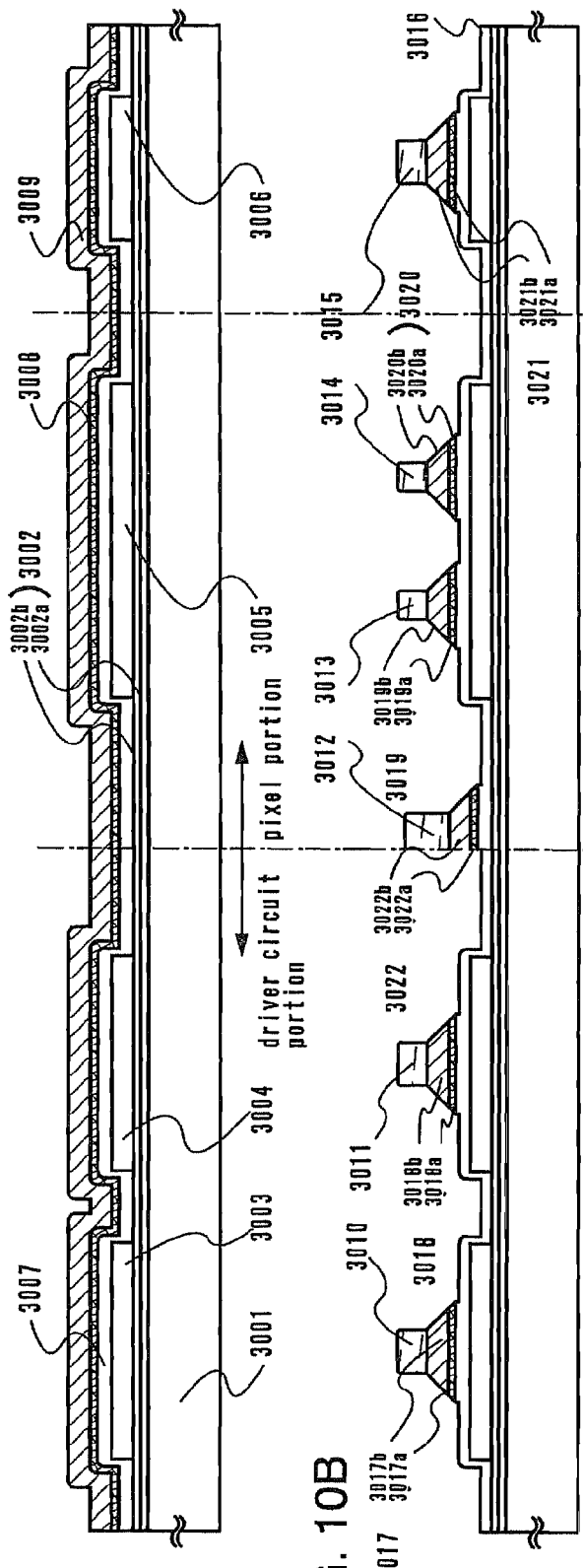
FIGS. 10A to 10C show an example of steps for forming a TFT according to the present invention.

First, as shown in FIG. 10A, a base film 3002 is formed from an insulating film such as a silicon oxide film, a silicon nitride film, or a silicon oxynitride film over a glass substrate 3001. The substrate 3001 is formed of glass such as barium borosilicate glass, typically, Corning #7059 glass or Corning #1737 glass (product of Corning Incorporated), aluminoborosilicate glass, or thermostable plastic. The base film 3002 is, for example, a laminate of a silicon oxynitride film 3002a that is formed from $SiH_4$, $NH_3$, and $N_2O$ by plasma CVD with a thickness of 10 nm to 200 nm (preferably 50 nm to 100 nm) and a silicon oxynitride hydride film 3002b formed from $SiH_4$ and $N_2O$ by plasma CVD with a thickness of 50 nm to 200 nm (preferably 100 nm to 150 nm). In this embodiment, although the base film is formed to have a bilayer structure, the base film may be a monolayer film or multilayer film of the insulating film.

A semiconductor film having an amorphous structure is crystallized by laser crystallization or a known thermal crystallization process to form a crystalline semiconductor film. The crystalline semiconductor film forms island-like semiconductor layers 3003 to 3006. The island-like semiconductor layers 3003 to 3006 each have a thickness of 25 nm to 80 nm (preferably 30 nm to 60 nm). The material of the crystalline semiconductor film is not limited; however, it is preferable to use silicon or a silicon germanium (SiGe) alloy.

When the crystalline semiconductor film is formed by laser crystallization, a pulsed or continuous wave excimer laser, a YAG laser, or a $YVO_4$ laser is used. Laser light emitted from a laser as those given in the above is desirably converged into a linear beam by an optical system before the irradiation of the semiconductor film. Conditions of crystallization are made suitably by an operator. However, when an excimer laser is used, the pulse oscillating frequency is set at 30 Hz and the laser energy density is set at 100 mJ/cm$^2$ to 400 mJ/cm$^2$ (generally 200 mJ/cm$^2$ to 300 mJ/cm$^2$). When a YAG laser is used, second harmonic thereof is employed and the pulse oscillating frequency is set at 1 kHz to 10 kHz while setting the laser energy density at 300 mJ/cm$^2$ to 600 mJ/cm$^2$ (generally 350 mJ/cm$^2$ to 500 mJ/cm$^2$). The laser light is converged into a linear beam having a width of 100 μm to 1000

μm, for example, 400 μm, to irradiate the entire substrate. The entire substrate is irradiated with the linear laser beam having width of 100 μm to 1000 μm, 400 μm for example, at an overlap ratio of 80% to 98%.

Next, a gate insulating film 3007 is formed so as to cover the island-like semiconductor layers 3003 to 3006. The gate insulating film 3007 is formed from an insulating film containing silicon by plasma CVD or sputtering so as to have a thickness of 40 nm to 150 nm. In this embodiment, a silicon oxynitride film having a thickness of 120 nm is used. Needless to say, the gate insulating film is not limited to a silicon oxynitride film, and other insulating films containing silicon, which has a monolayer or a layered structure. For example, when a silicon oxide film is used for the gate insulating film, the film can be formed by mixing TEOS (tetraethyl orthosilicate) with $O_2$ by plasma CVD and by discharging it under the following conditions: the reaction pressure is set at 40 Pa, the substrate temperature at 300° C. to 400° C., the frequency is set high at 13.56 $MH_z$, and the power density is set at 0.5 $W/cm^2$ to 0.8 $W/cm^2$. The silicon oxide film thus formed can provide the gate insulating film with excellent characteristics after it is subjected to following thermal annealing at 400° C. to 500° C.

On the gate insulating film 3007, a first conductive film 3008 and a second conductive film 3009 for forming a gate electrode are formed. In this embodiment, the first conductive film 3008 is a Ta film with a thickness of 50 nm to 100 nm and the second conductive film 3009 is a W film with a thickness of 100 nm to 300 nm.

The Ta film is formed by sputtering Ta target by Ar. In this case, an appropriate amount of Xe or Kr is added to Ar to ease the internal stress of the Ta film and thus prevent the Ta film from peeling off. The resistivity of a Ta film in α phase is about 20 μΩcm and is applicable to a gate electrode. On the other hand, the resistivity of a Ta film in β phase is about 180 μΩcm and is not suitable for a gate electrode. A Ta film in α phase can readily be obtained when a base with a thickness of about 10 nm to 50 nm is formed from tantalum nitride that has a crystal structure similar to that of the α phase Ta film.

The W film is formed by sputtering using W as a target. Alternatively, the W film may be formed by thermal CVD using tungsten hexafluoride ($WF_6$). In either case, the W film is required to have low resistivity in order to be used as a gate electrode. A desirable resistivity of the W film is 20 μΩcm or less. The resistivity of the W film can be reduced by increasing the crystal grain size. However, when the W film contains many impurity elements such as oxygen, crystallization is inhibited and the resistivity is increased. Accordingly, when the W film is formed by sputtering, a W target with a purity of 99.9999% is used and great care is taken in preventing impurities in the air to mix into the W film. As a result, the W film can have a resistivity of 9 μΩcm to 20 μΩcm.

Although Ta is used for the first conductive film 3008 and W is used for the second conductive film 3009 in this embodiment, but is not limited thereto. The conductive films may be formed of any element selected from the group consisting of Ta, W, Mo, Al, and Cu, or of an alloy material or compound material mainly containing the elements listed above. Further, a semiconductor film typified by a polysilicon film doped with an impurity element such as phosphorus may be used instead. Other desirable combinations of materials for the first and second conductive films than the one shown in this embodiment include: tantalum nitride (TaN) for the first conductive film 3008 and W for the second conductive film 3009; tantalum nitride (TaN) for the first conductive film 3009 and Al for the second conductive film 3008; and tantalum nitride (TaN) for the first conductive film 3008 and Cu for the second conductive film 3009.

Further, in the case where there occurs no problem even if the size of each LDD is reduced, a monolayer structure of W or the like may be used. In this case, the length of the LDD can be reduced by setting a taper angle close to a right angle even if the same structure is used.

Next, resist masks 3010 to 3015 are formed to carry out first etching for forming electrodes and wirings. In this embodiment, ICP (inductively coupled plasma) etching that uses a mixture of $CF_4$ and $Cl_2$ as an etching gas and an RF (13.56 MHz) power of 500 W is applied to a coiled electrode at a pressure of 1 Pa to generate plasma. The substrate side (sample stage) also receives an RF (13.56 MHz) power of 100 W so that a substantially negative self-bias voltage is applied. When the mixture of $CF_4$ and $Cl_2$ is used, the W film and the Ta film are etched to the same degree.

Under the above etching conditions, by properly shaping the resist mask, the edges of the first conductive film and the second conductive film are tapered by the effect of the bias voltage applied to the substrate side. The angle of the tapered portions is 15° to 45°. In order to etch the conductive films without leaving any residue on the gate insulating film, the etching time may be prolonged by about 10% to 20%. The selective ratio of the W film to the silicon oxynitride film is 2 to 4 (typically 3), and therefore a region where the silicon oxynitride film is exposed is etched by about 20 nm to 50 nm by over-etching. Thus, first shape conductive layers 3017 to 3022 including first conductive layers 3017a to 3022a and second conductive layers 3017b to 3022b are formed from the first conductive film and the second conductive film through the first etching treatment. At this point, regions of the gate insulating film 3007 that are not covered with the first shape conductive layers 3017 to 3022 are etched and thinned by about 20 nm to 50 nm (FIG. 10B). As a result, a region 3016 reduced in thickness is formed.

Subsequently, as shown in FIG. 10C, second etching is performed in a state where the resist masks 3010 and 3015 are not removed. The W film is selectively etched using $CF_4$, $Cl_2$, and $O_2$ as an etching gas. On that occasion, conductive layers 3024 to 3029 each having a second shape (first conductive layers 3024a to 3029a and second conductive layers 3024b to 3029b) are formed through the second etching. At this point, each area of the gate insulating film 3007 that is not covered with the conductive layers 3024 to 3029 having the second shape is further etched by around 20 nm to 50 nm, so that a region 3023 reduced in thickness is formed.

The reaction of the W film and the Ta film to etching using the mixture gas of $CF_4$ and $Cl_2$ can be inferred from the vapor pressure of radical or ion species generated and of reaction products. Comparing the vapor pressure among fluorides, and chlorides of W and Ta; $WF_6$ that is a fluoride of W has a yet higher vapor pressure while the others, such as $WCl_5$, $TaF_5$, and $TaCl_5$ have a vapor pressure of about the same degree. Accordingly, the W film and the Ta film are both etched with the mixture gas of $CF_4$ and $Cl_2$. However, when an appropriate amount of $O_2$ is added to this mixture gas, $CF_4$ and $O_2$ react to each other and changed into CO and F, so that a large amount of F radicals or F ions generate. As a result, the W film whose fluoride has a high vapor pressure is etched at an increased etching rate. Meanwhile, the etching rate of the Ta film is not increased much although F ions are increased in number. Since Ta is more easily oxidized than W, the addition of $O_2$ results in oxidization of the surface of the Ta film. The oxide of Ta does not react with fluorine or chlorine and therefore the etching rate of the Ta film is reduced further.

Thus, the etching rate of the W film and the Ta film vary, so that the etching rate of the W film is set faster than the etching rate of the Ta film.

Then, an impurity element for giving an n-type conductivity is added by first doping. The doping may be either ion doping or an ion implantation. The ion doping is carried out in a condition where a dose is set at from $1\times10^{13}$ atoms/cm$^2$ to $5\times10^{14}$ atoms/cm$^2$, and an acceleration voltage is set at from 60 keV to 100 keV. A group 15 element, typically phosphorus (P) or arsenic (As), is used as the impurity element for giving the n-type conductivity. Phosphorus (P) is used here. In this case, the conductive layers 3024 to 3029 serve as masks for the impurity element for giving the n-type conductivity, and first impurity regions 3030 to 3033 are formed in a self-aligning manner. The impurity element for giving the n-type conductivity is added to the first impurity regions 3030 to 3033 at a concentration range from $1\times10^{20}$ atoms/cm$^3$ to $1\times10^{21}$ atoms/cm$^3$ (FIG. 10C).

Figure 11A:
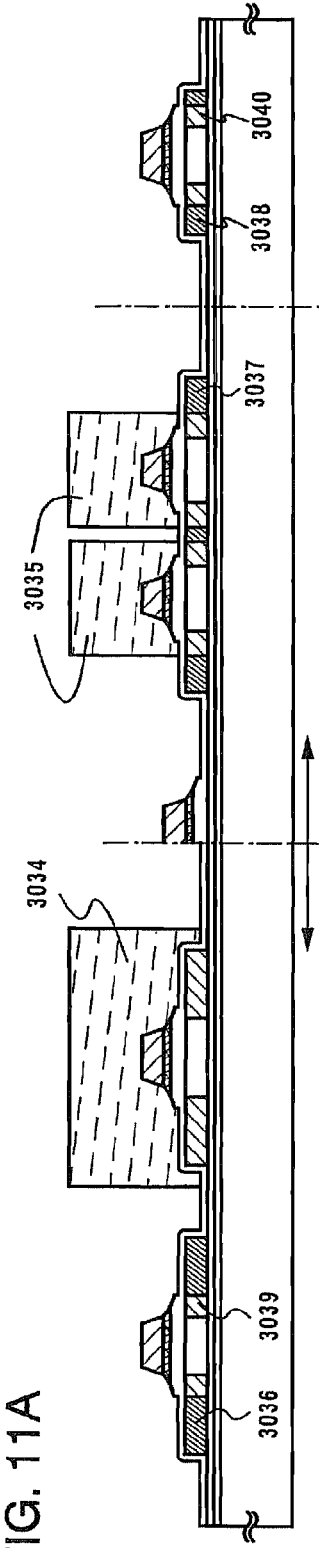
FIGS. 11A to 11C show an example of steps for forming a TFT according to the present invention.

Then, second doping processing is performed in a state shown in FIG. 11A where portions that are to be a p-type TFT and a pixel TFT are covered with resist masks 3034 and 3035. On that occasion, the pixel TFT is not entirely covered by the resist masks, and doping is performed in a state where the outside of the TFT is exposed. The second doping is performed by doping an impurity element that gives the n-type conductivity in a condition where the dosage is reduced from that of the first doping and the acceleration voltage is increased from that of the first doping. For instance, the second doping is performed by setting the acceleration voltage at 70 keV to 120 keV and setting the dosage at $1\times10^{13}$ atoms/cm$^2$, thereby forming new impurity regions 3036 to 3038 within the first impurity regions 3030 to 3033 formed over the island-like semiconductor layers in FIG. 10B. The conductive layers 3024 and 3028 having the second shape are used as masks for the impurity element and the doping is performed so that the impurity element is also added to the semiconductor layers existing under areas of the first conductive layers 3024a and 3028a that are not covered with the resist masks. In this manner, third impurity regions 3039 and 3040 are formed. The concentration of phosphorus (P) added to these third impurity regions 3039 and 3040 has a gentle concentration gradient along the film thickness of the tapered portions of the first conductive layers 3024a and 3028a. In the semiconductor layers that overlap the tapered portions of the first conductive layers 3024a and 3028a, the impurity concentration is slightly lower around the center than at the edges of the tapered portions of the first conductive layers 3024a and 3028a. However, the difference is very slight and almost the same impurity concentration is kept throughout the semiconductor layers.

Figure 11B:
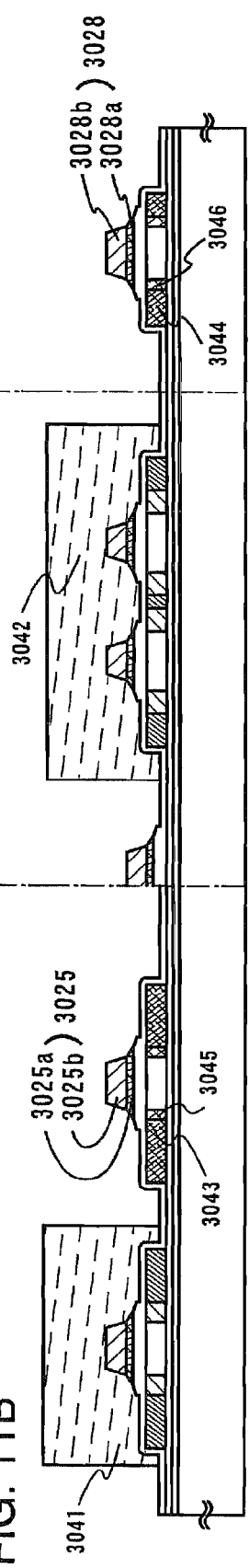
Figure 11C:
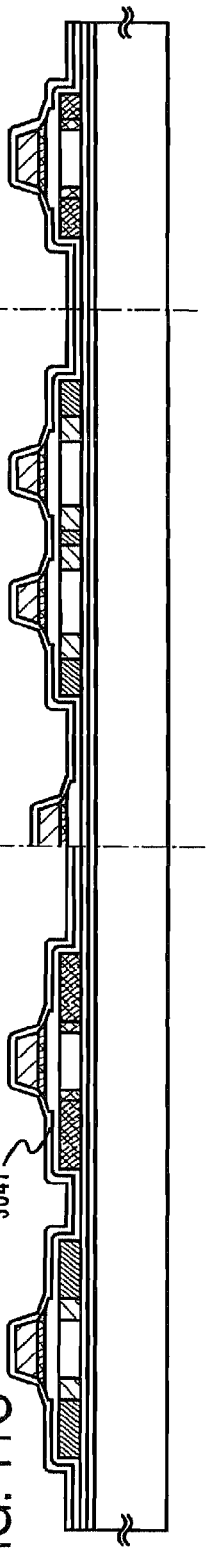

Then, as shown in FIG. 11B, fourth impurity regions 3043 and 3044, that are p-doped, are formed on the island-like semiconductor layer 3004 forming a p-TFT and the island-like semiconductor layer 3006 forming a storage capacitor. By using the conductive layers 3025b and 3028b having the second shape as masks for the impurity element, impurity regions are formed in a self-aligned manner. On that occasion, the island-like semiconductor layer 3003 forming an n-TFT and the pixel TFT 3005 are entirely covered by the resist masks 3041 and 3042. The conductive layers 3025 and 3028 having the second shape are used as the masks for the impurity element and the doping is performed so that the impurity element is also added to the semiconductor layers under areas of the first conductive layers 3025a and 3028a that are not covered by the resist masks. In this manner, fifth impurity regions 3045 and 3046 are formed. The phosphorus is added to impurity regions 3043 and 3044 at different concentrations. However, these regions are formed by ion doping using diborane (B$_2$H$_6$), and the concentration of the impurity is set in a range of $2\times10^{20}$ atoms/cm$^3$ to $2\times10^{21}$ atoms/cm$^3$ in both regions.

Through the steps described above, impurity regions are formed in respective island-like semiconductor layers. The conductive layers 3024 to 3027 having the third shape overlapping the island-like semiconductor layers serve as gate electrodes. Also, the element numbered 3029 serves as an island-like source signal line, while the element numbered 3028 serves as a capacitor wiring.

After the resist masks 3041 and 3042 are removed, the impurity elements doped to the respective island-like semiconductor layers are activated in order to control the conductivity type. The activation is carried out by thermal annealing using an annealing furnace. Alternatively, laser annealing or rapid thermal annealing (RTA) is applicable. The thermal annealing is generally conducted in a nitrogen atmosphere with an oxygen concentration of 1 ppm or less, preferably 0.1 ppm or less, at 400° C. to 700° C., typically 500° C. to 600° C. In this embodiment, the substrate is subjected to the heat treatment at 500° C. for four hours. However, when the wiring material used for the third shape conductive layers 3024 to 3029 are sensitive to heat, the activation is desirably performed after an interlayer insulating film 3047 (mainly containing silicon) is formed, in order to protect the wirings and the like.

Another heat treatment is conducted in an atmosphere containing 3% to 100% hydrogen at 300° C. to 450° C. for one to 12 hours, thereby hydrogenating the island-like semiconductor layers. The hydrogenation is carried out for terminating dangling bonds in the semiconductor layers using hydrogen excited by heat. Alternatively, plasma hydrogenation (using hydrogen that is excited by plasma) may be employed.

The first interlayer insulating film 3047 is formed next from a silicon oxynitride film with a thickness of 100 nm to 200 nm. Then, a second interlayer insulating film 3048 made of an organic insulating material such as acrylic, is formed over the first interlayer insulating film 3047. Also, as the second interlayer insulating film 3048, it is possible to use an inorganic material instead of the organic insulating material may be used. As the inorganic material, an inorganic SiO$_2$, SiO$_2$ (PCVD-SiO$_2$) produced by plasma CVD, SOG (Spin on Glass; applied silicon oxide film), or the like. After two interlayer insulating films are formed, an etching process is performed to form contact holes.

Then, in the driver circuit area, there are formed source wirings 3049 and 3050 that connects to source regions of the island-like semiconductor layers and a drain wiring 3051 that connects to drain regions. Also, in the pixel area, a connection electrode 3052 and pixel electrodes 3053 and 3054 are formed (FIG. 12A). The source signal line 3029 is electrically connected with a writing TFT by means of the connection electrode 3052. Incidentally, the pixel electrodes 3053 and 3054, and a storage capacitor are for the adjacent pixels.

Note that, the writing TFT has a double-gate structure in this embodiment; however, the TFT may alternatively have a single-gate structure, a triple-gate structure, or a multi-gate structure having a plurality of gates.

In the manner described above, it is possible to form the driver circuit area having the n-TFT and p-TFT as well as the pixel area having the writing TFT and the storage capacitor on the same substrate. Such a substrate is referred to as an active matrix substrate in this specification.

In this embodiment, the edge portions of the pixel electrodes are arranged so as to overlap source signal lines and writing gate signal lines. With this structure, the spaces among the pixel electrodes can be shaded from the light without using a black matrix.

Also, according to the steps described in this embodiment, the number of necessary photomasks for producing the active matrix substrate is to be five. That is, an island-like semiconductor layer pattern, a first wiring pattern (source signal line, capacitor wiring), a mask pattern for p-doped regions, a contact hole pattern, and a second wiring pattern (including pixel electrodes and connection electrodes). This makes it possible to reduce the number of the steps and contributes to a reduction in manufacturing cost and an improvement in yields.

Subsequently, after the active matrix substrate shown in FIG. 12B is obtained, an alignment layer 3055 is formed over the active matrix substrate and rubbing is performed.

Meanwhile, a counter substrate 3056. On the counter substrate 3056, there are formed color filter layers 3057 to 3059 and an overcoat layer 3060. As to the color filter layers, a red color filter layer 3057 and a blue color filter layer 3058 are formed above the TFTs so as to overlap each other. By doing so, the color filter layers are given a construction where these color filter layers double as shading films. It is required that at least spaces among the TFTs, the connection electrode, and the pixel electrodes are shaded, so that it is preferable that the red color filter and the blue color filter are arranged so as to overlap each other and to shade these spaces.

Also, with reference to the connection electrode 3052, the red color filter layer 3057, the blue color filter layer 3058, and the green color filter layer 3059 are set so as to overlap each other and a spacer 3064 is formed. The color filter in each color is obtained by forming a film having a thickness of 1 to 3 µm using a material obtained by mixing an acrylic resin with a pigment. It is possible to form these color filters in a predetermined pattern using a mask made of a photosensitive material. It is possible to set the height of the spacer 3064 at 2 to 7 µm (preferably, at 4 to 6 µm) with consideration given to the thickness of the overcoat layer 3060 that is 1 to 4 µm, and a gap is formed by this height when the active matrix substrate and the counter substrate are bonded together. The overcoat layer 3060 is formed using an organic resin material of a light curing type or a thermal curing type and there is used polyimide, an acrylic resin, or the like, for instance.

The spacer 3064 can be placed arbitrarily; however, it is preferable to arrange it over a counter electrode 3061, for example, in a position above the connection electrode, as shown in FIG. 12B. The spacer 3064 may be arranged over the counter electrode 3061 so as to meet the position above the TFT of the driver circuit area. The pacer 3064 is arranged entirely over the surface of the driver circuit area, or may be arranged do as to cover the source wiring and the drain wiring.

After the overcoat layer 3060 is formed, counter electrodes 3061 are formed through patterning. Then, after an alignment layer 3062 is formed, there is performed rubbing processing.

Then, the active matrix substrate, on which the pixel area and the driver circuit area have been formed, and the counter substrate are bonded together using a sealant 3065. Filler is blended into the sealant 3065 and the two substrates are bonded together so that a uniform space is maintained therebetween by this filler and the spacer. Following this, a liquid crystal material 3063 is injected between these substrates and these substrates are completely sealed with a sealing agent (not shown). It is sufficient that a publicly known liquid crystal material is used as the liquid crystal material 3063. In this manner, there is obtained the active matrix type liquid crystal display apparatus shown in FIG. 12B.

Note that the TFTs in the active matrix type liquid crystal display device manufactured as described above has a top-gate structure; however, this embodiment can easily be applied to a bottom-gate type TFTs or TFTs having another structure.

It is possible to implement this embodiment by freely combining this embodiment with the embodiment mode and Embodiments 1 to 3.

Embodiment 5

Among display devices using an input circuit explained in the embodiment mode, one having a structure which is different from Embodiments 1 to 3 will be described with reference to FIG. 6 in this embodiment.

When pulses or the like are used to reset an input circuit periodically, the output right before resetting is required to be held. On that account, as shown in FIG. 6, potentials VH and VL are provided for reset, and 602 and 603 respectively serve as the control switches.

When pressure applied to a variable capacitor 604 that uses a dielectric is high (output 1), VH is input to a sense amplifier 601 by closing the control switch 603. When pressure applied to the variable capacitor 604 is low (output zero), VL is input to the sense amplifier 601 by closing the control switch 602. Thus, the output right before resetting can be kept.

Figure 7:
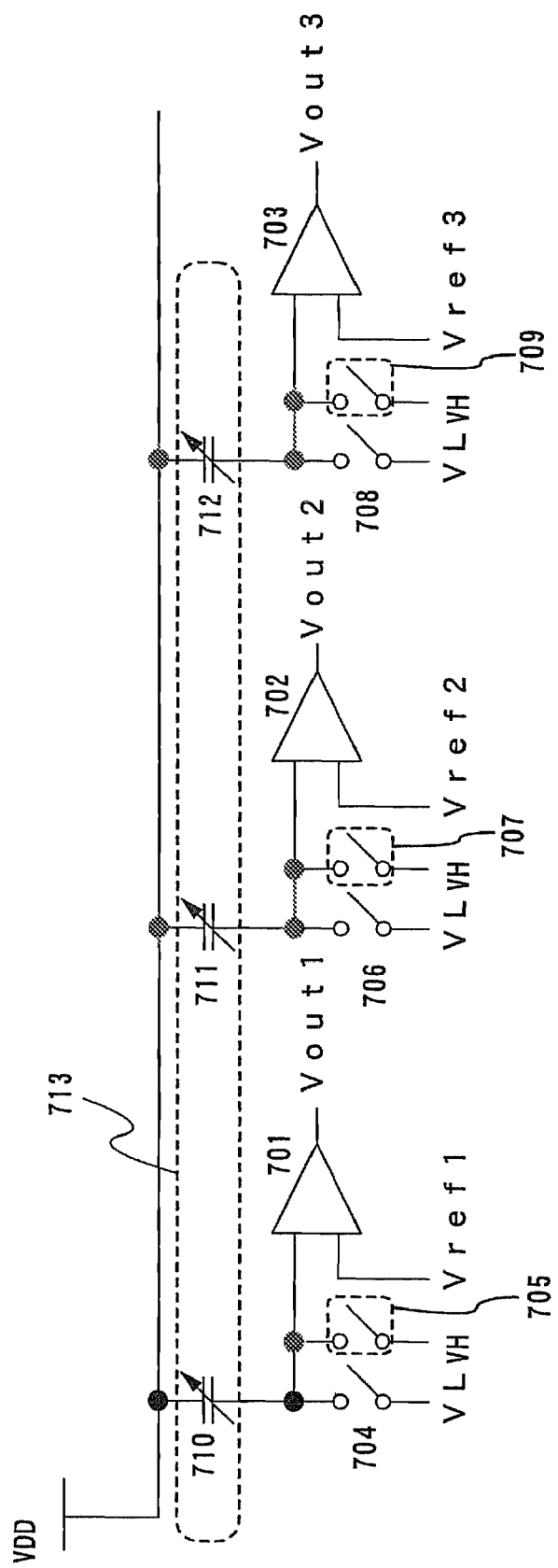
FIG. 7 shows an embodiment of the present invention.

Further, a plurality of such circuits are provided for one input so as to have different Vref respectively, and the respective Vref and the changed voltages are contrasted thereby enabling multiple output rather than binary output. FIG. 7 shows sense amplifiers 701 to 703 having Vref 1 to Vref 3 which have different voltages as reference voltages, reset switches 704 to 709 of the respective sense amplifiers, variable capacitors 710 to 712 using dielectrics, and an input unit 713.

The respective variable capacitors are provided so that the variable capacitors 710, 711, and 712 have the same capacitance and the input from the input unit 713 is applied equally to each.

When input from the input unit 713 is generated, capacitances of the variable capacitors change, and voltages applied to the sense amplifiers 701 to 703 change accordingly. When the voltages exceeded the respective reference voltages Vref 1 to Vref 3, each output of Vout 1 to 3 is to be HIGH.

When reference voltages Vref 1 to Vref 3 are Vref 1>Vref 2>Vref 3, the output shall have 4 values of "all LOW", "Vout 3 is HIGH, and the others are LOW", "Vout 2 and Vout 3 are HIGH, and Vout 1 is LOW", and "all HIGH" in accordance with the strength of input.

In FIG. 7, a structure in which 3 sense amplifiers have output of 4 values; however, the number of sense amplifiers can be determined freely.

Figure 8:
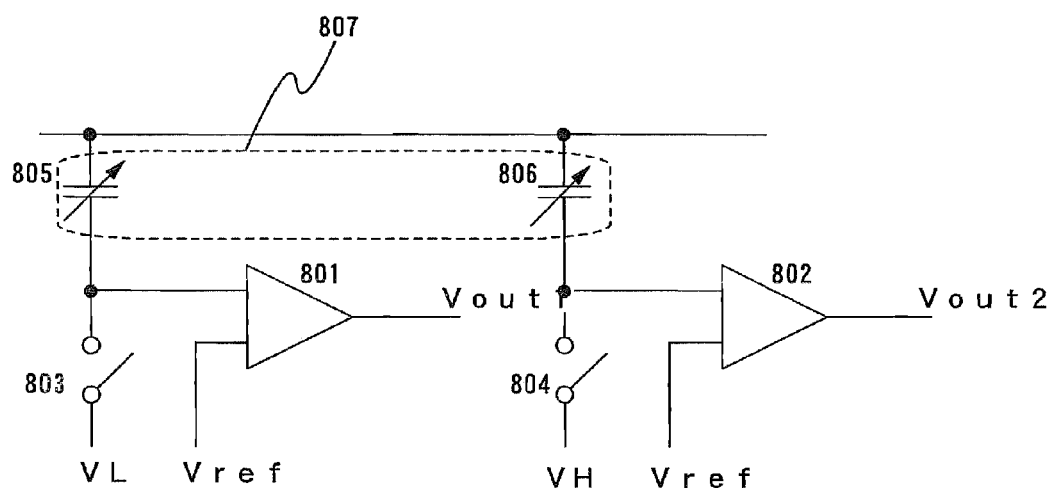
FIG. 8 shows an embodiment of the present invention.

When two sense amplifiers are used, a reset signal for high potential and a reset signal for low potential can be input by the respective amplifiers. Accordingly, when the value of the variable capacitance changes greatly, that is, when the input unit is pushed and released, each operation can be sensed thereby generating signals. FIG. 8 shows a circuit configured with sense amplifiers 801 and 802 having the same reference voltages, reset switches 803 and 804, and variable capacitors 805 and 806 using dielectrics.

Figure 9:
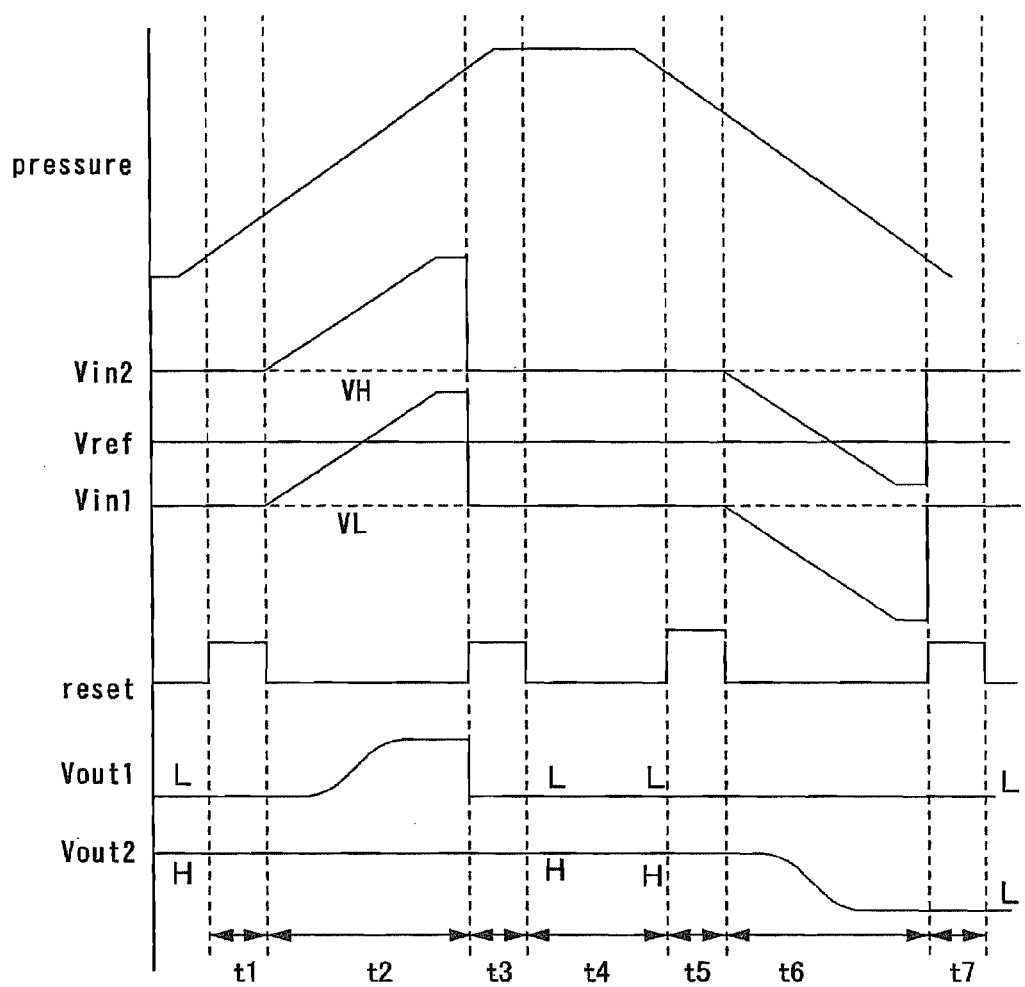
FIG. 9 shows an example of change of output with respect of input over time in an embodiment of the present invention.

Variable capacitors 805 and 806 have the same capacitance, and the capacitance can be changed by means of a common input unit 807. The sense amplifiers 801 and 802 can be reset periodically and simultaneously by using a low voltage reset signal VL and a high voltage reset signal VH, so that the change during the reset period. The operation thereof is shown in FIG. 9.

Thus, Vout is HIGH when the variable capacitance is increased, and Vout is LOW when the capacitance is reduced. As a result, the changes can be detected whether the variable capacitance is increased or reduced.

By forming a display device as above, change of input can be read even during the reset period, thereby improving reliability. Further, multiple values for one input unit is possible, so that more detailed input can be performed. Accordingly, more sophistication of a semiconductor device can be aimed.

This embodiment can be freely combined with any of the embodiment mode and Embodiments 1 to 4.

Embodiment 6

In this embodiment, a specific example of using an input circuit shown in the embodiment mode will be explained.

Two ways of level sense and edge sense are given as examples of input methods. The circuit shown in FIGS. 1A and 1B is edge sensitive; the signal of HIGH is output by a sense amplifier only when the input unit is pushed. On the other hand, in the case of level sensitive, HIGH signal is kept during the push operation.

Figure 6:
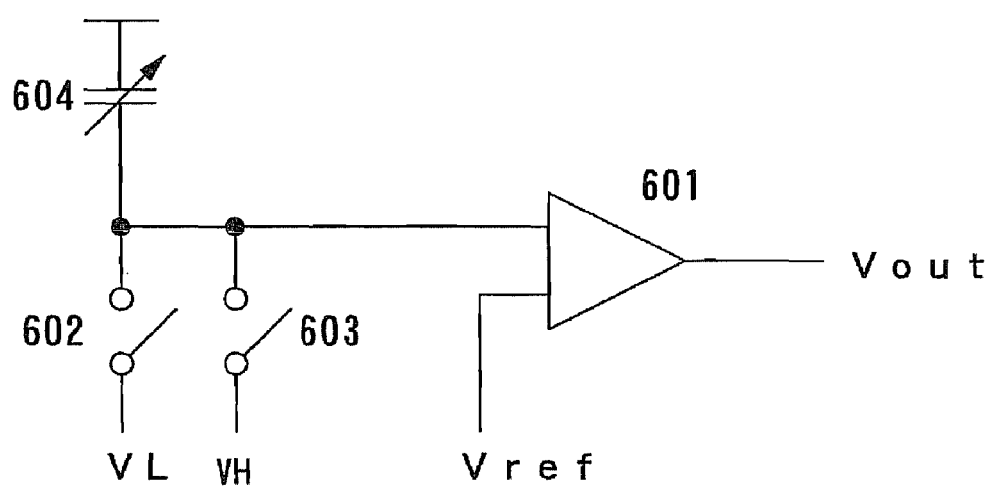
FIG. 6 shows an embodiment of the present invention.

An example of a level sensitive input circuit is shown in FIG. 6. As for the circuit, two potentials of VL and VH are provided as reset inputs; output right before reset can be kept by selecting either one of VL and VH in accordance with the output of a sense amplifier 601.

In FIG. 6, VL is lower than a reference voltage Vref, and VH is higher than the reference voltage Vref. The output of the sense amplifier is LOW when the switch 602 is ON, and the output of the sense amplifier is HIGH when the switch 603 is ON. A logical product of the output of the sense amplifier 601 and the reset signal, and a logical product of the inverted output of the sense amplifier 601 and a reset signal are used as control signals for switches 602 and 603. Thus, the output right before reset can be kept.

Further, when a structure in which plurality of such circuits is provided for one input, and each circuit has different reference voltage is used, the change of variable capacitance can be detected in multiple stages. FIG. 7 shows sense amplifiers 701 to 703 including Vref 1 to Vref 3 each of which has a different voltage respectively as a reference voltage, reset switches 704 to 709 of respective sense amplifiers, variable capacitors 710 to 712 using dielectrics, and an input unit 713.

The respective variable capacitors 710, 711, and 712 are provided so that the variable capacitors have the same capacitances and the input from the input unit 713 is applied equally to each.

When input to the input unit 713 is generated, capacitances of the variable capacitors change, and voltages applied to the sense amplifiers 701 to 703 change accordingly. When the voltages exceeded the respective reference voltages Vref 1 to Vref 3, each output of Vout 1 to 3 is to be HIGH.

When reference voltages Vref 1 to Vref 3 are Vref 1>Vref 2>Vref 3, the output shall have 4 values of "all LOW", "Vout 3 is HIGH, and the others are LOW", "Vout 2 and Vout 3 are HIGH, and Vout 1 is LOW", and "all HIGH" in accordance with the strength of input.

In FIG. 7, a structure in which 3 sense amplifiers have output of 4 values; however, the number of sense amplifiers can be determined freely.

Figure 16A:
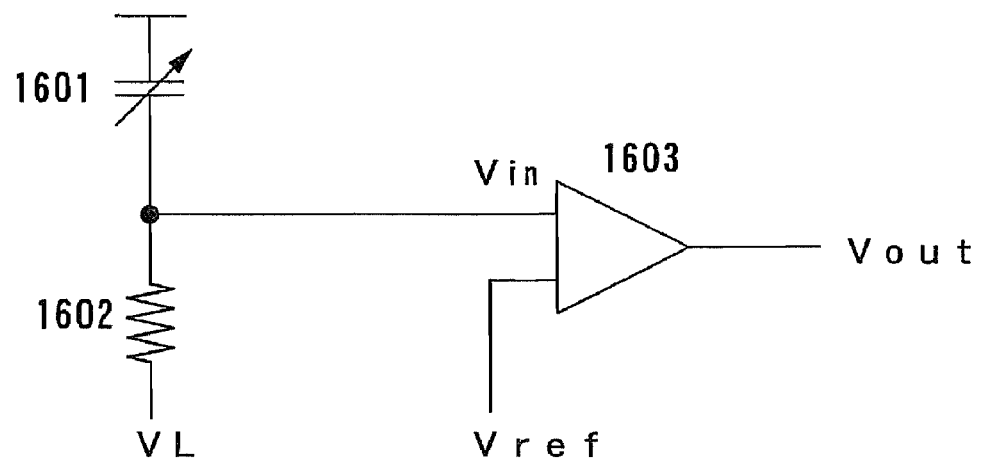
FIGS. 16A and 16B show an embodiment of the present invention.
Figure 16B:
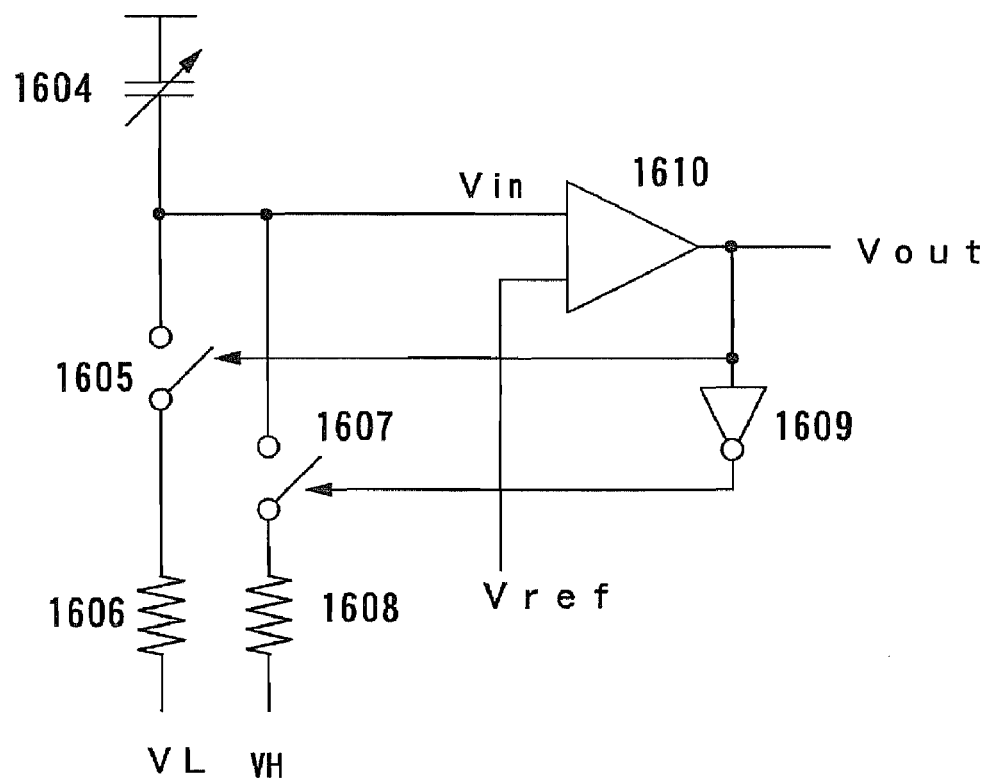

Further, a structure that does not use a reset signal can be used by employing a resistor element. An example of such a circuitry is shown in FIGS. 16A and 16B. The circuit in FIG. 16A includes a variable capacitor 1601, a resistor 1602, and a sense amplifier 1603. The circuit has a structure of a circuit in FIG. 1A, in which a resistor element is connected instead of a reset switch.

Further, FIG. 16B shows a structure of a circuit in FIG. 6, in which a resistor is connected instead of a reset switch and the resistor element is selected in accordance with the output of the sense amplifier. The circuit includes a variable capacitor 1604, a switch 1605, a resistor 1606, a switch 1607, a resistor 1608, an inverter 1609, and a sense amplifier 1610.

Figure 17A:
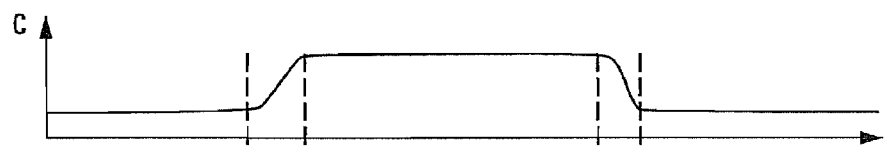
FIGS. 17A to 17E show an example of change of output with respect of input over time in an embodiment of the present invention.
Figure 17B:
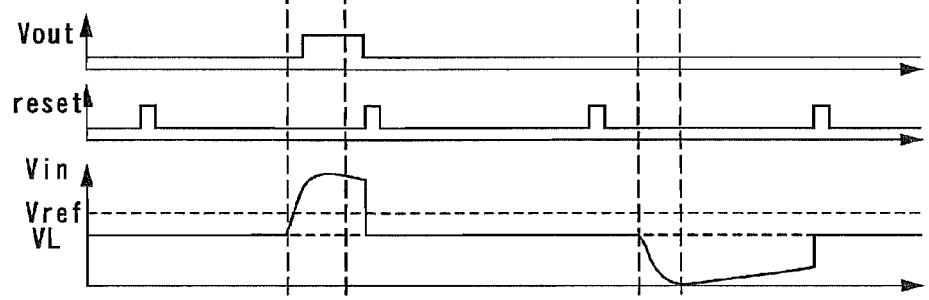
Figure 17C:
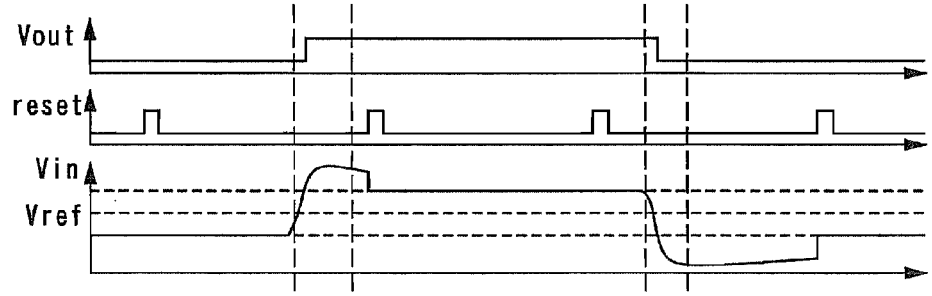
Figure 17D:
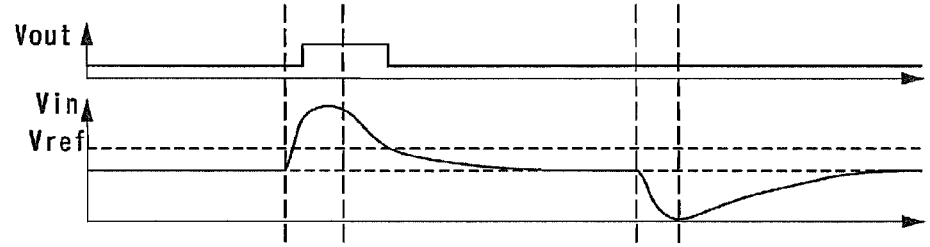
Figure 17E:
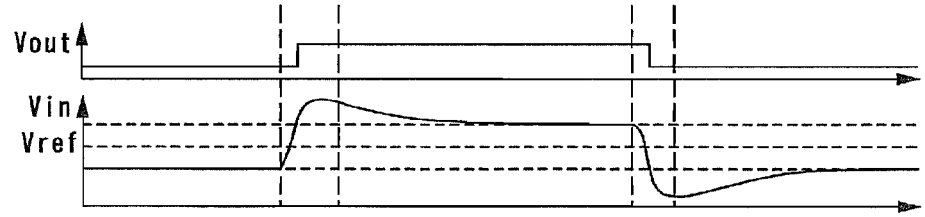

A timing chart of respective input circuits is shown in FIGS. 17A to 17E. FIG. 17A shows the capacitance of a variable capacitor. FIG. 17B shows input and output to the sense amplifier and a reset signal of the circuit shown in FIG. 1. FIG. 17C shows input and output to the sense amplifier and a reset signal of the circuit shown in FIG. 6. FIG. 17D shows input and output to the sense amplifier and a reset signal of the circuit shown in FIG. 16A. FIG. 17E shows input and output to the sense amplifier and a reset signal of the circuit shown in FIG. 16B.

FIGS. 17A to 17E show a timing chart in which a case where input unit is pushed awhile is assumed. In FIG. 17A, variable capacitance increases for a certain period. For such input, output signals of circuits shown in FIG. 1 and FIG. 16A show edge sensitive behavior in which HIGH pulse is output when the capacitance of the variable capacitor is increased. On the other hand, output signals of circuits shown in FIG. 6 and FIG. 16B show level sensitive behavior in which HIGH pulse is output during the period when the variable capacitance is increased.

Some specific examples of an input circuit are shown in this embodiment; however, when a display device of the present invention is formed, the circuitry may be selected according to usage. The circuit may use another structure without limitation to the input circuit above. This embodiment can be freely combined with the embodiment mode and Embodiments 1 to 5.

Embodiment 7

Among display devices using an input circuit explained in the embodiment mode, one having a structure which is different from Embodiments 1 to 3 and Embodiment 6 will be described with reference to FIG. 14 in this embodiment.

Figure 14:
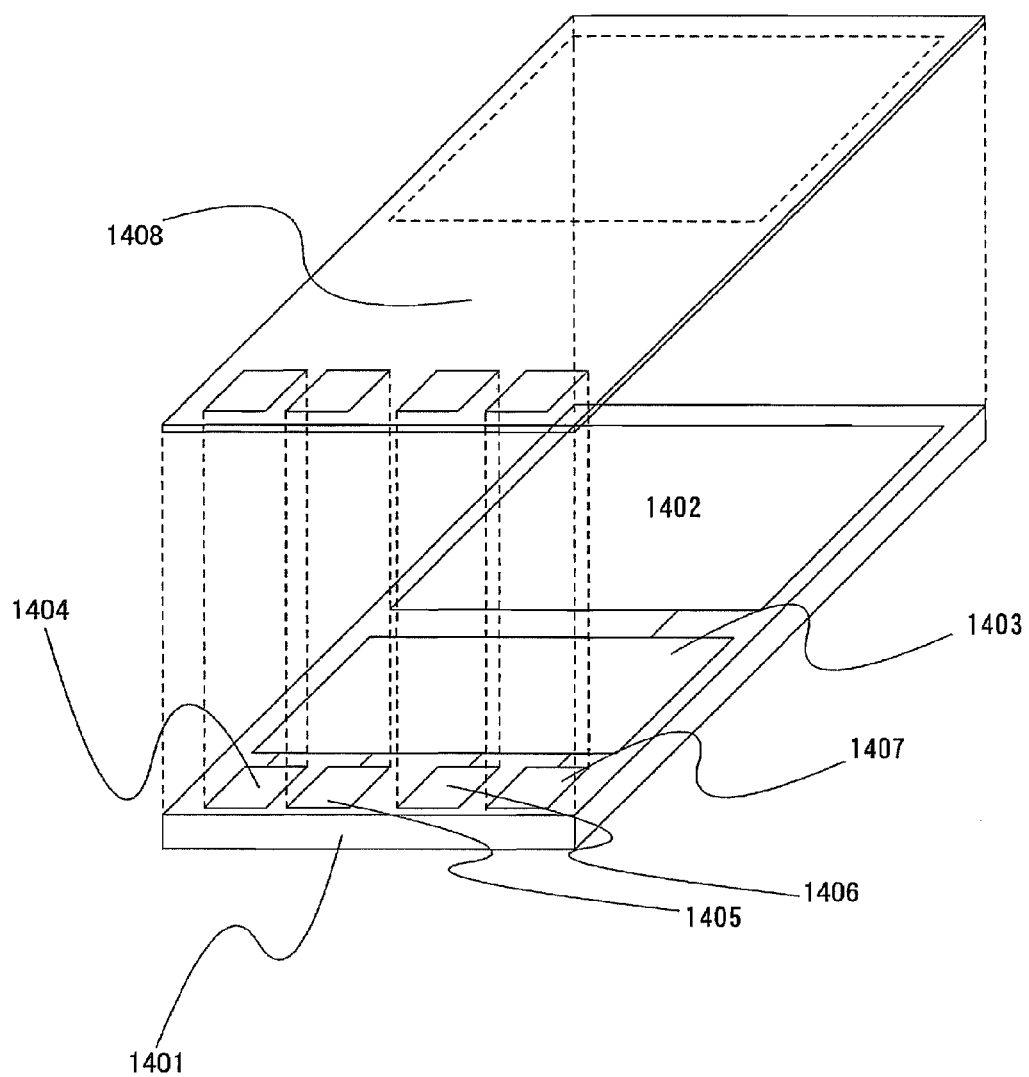
FIG. 14 shows an embodiment of the present invention.

FIG. 14 shows an example in which liquid crystal for input is also used for other display parts (input units here).

In FIG. 14, a display portion 1402, a controller 1403 including a CPU and an image processing circuit, a driver circuit and the like, input units 1404 to 1407 performing input and display, and a counter substrate 1408 are provided over a substrate 1401 made of glass or plastic.

The number of input areas can be decided freely without limitation to this embodiment.

The input units 1404 to 1407 are formed from liquid crystal and two electrodes sandwiching the liquid crystal. The liquid crystal for input can be used for display when the upper electrode is a transparent electrode made of ITO or the like, and a driver circuit for display is applied.

By using such a structure, the number of display portions can be increased other than the display portion 1402.

For example, in a display device that has plural input areas, the input area may be highlighted by emitting light or the like when input is performed into the input area. That can lead to more specification of a semiconductor device.

This embodiment can be freely combined with any of the embodiment mode and Embodiments 1 to 6.

Embodiment 8

The invention may be applied to electronic devices such as a video camera, a digital camera, a goggle display (head mounted display), a navigation system, a sound reproduction device (a car audio, a component stereo, and the like), a laptop personal computer, a game machine, a personal digital assistant (a mobile computer, a mobile phone, a portable game machine, a electronic book, and the like), image player with a recording medium (specifically, a device with a display which plays a recording medium such as digital versatile disc (DVD) and display the images), or the like. Examples of those electronic devices are shown in FIGS. 13A to 13G.

Figure 13A:
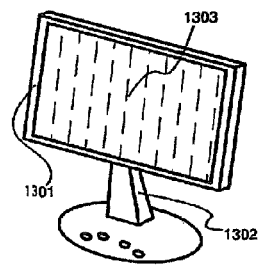
FIGS. 13A to 13G show examples of electronic devices using the present invention.

FIG. 13A illustrates a liquid crystal display or an OLED display including a case 1301, a stand 1302, a display part 1303 and the like. The present invention can be applied to the display part 1303.

Figure 13B:
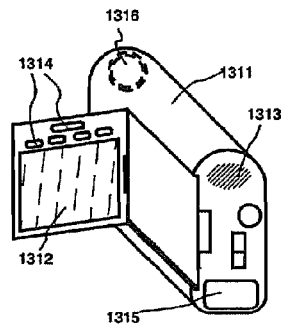

FIG. 13B illustrates a video camera including a main body 1311, a display part 1312, an audio input portion 1313, operating switches 1314, a battery 1315, an image receiving portion and the like. The present invention can be applied to the display part 1312.

Figure 13C:
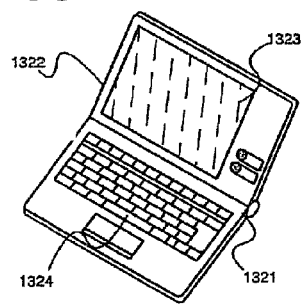

FIG. 13C illustrates a laptop personal computer including a main body 1321, a case 1322, a display part 1323, a keyboard 1324 and the like. The present invention can be applied to the display part 1323.

Figure 13D:
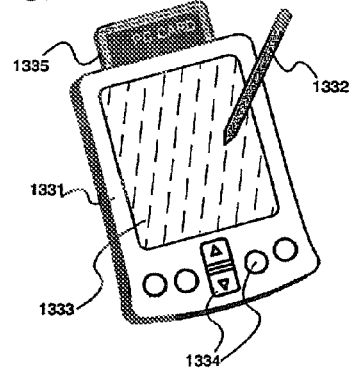

FIG. 13D illustrates a Personal Digital Assistant including a main body 1331, a stylus 1332, a display part 1333, operating buttons 1334, an external interface 1335 and the like. The present invention can be applied to the display part 1333.

Figure 13E:
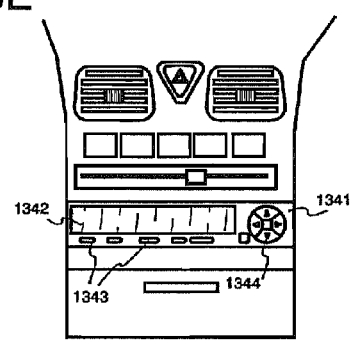

FIG. 13E illustrates a audio player device, especially an car audio including a main body 1341, a display part 1342, operating switches 1343 and 1344 and the like. The invention can be applied to the display part 1342. Furthermore, the invention can be applied to any of portable or home audio devices other than the above-described audio device mounted in a motor vehicle.

Figure 13F:
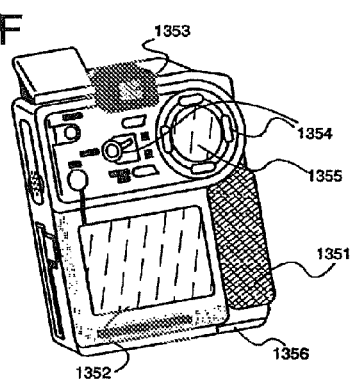

FIG. 13F illustrates a digital camera including a main body 1351, a display part (A) 1352, an ocular portion 1353, operating switches 1354, a display part (B) 1355, a battery 1356 and the like. The present invention can be applied to the display parts (A) 1352 and (B) 1355.

Figure 13G:
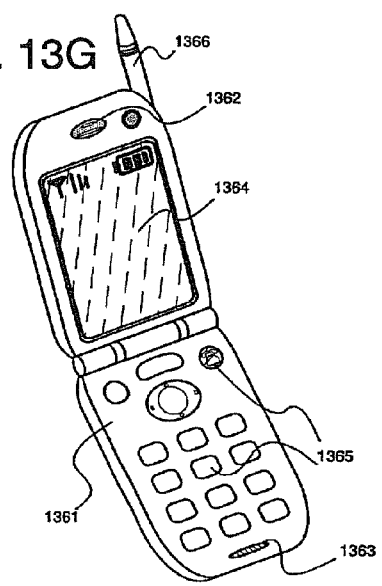

FIG. 13G illustrates a mobile phone including a main body 1361, an audio output portion 1362, an audio input portion 1363, a display part 1364, operating switches 1365, an antenna 1366 and the like. The present invention can be applied the display part 1364.

A plastic substrate with high heat resistance other than a glass substrate can also be applied to the display device of these electronic devices. Further weight saving can be achieved thereby.

Note that the above-described devices of this embodiment are only examples and that the invention is not limited thereto.

This embodiment can be freely combined with any of the embodiment mode and Embodiments 1 to 7.

What is claimed is:

1. A semiconductor device comprising:
a first substrate;
a first circuit over the first substrate, the first circuit comprising a sense amplifier and a switch;
a second circuit over the first substrate;
a variable capacitor over the first circuit and the second circuit;
a display portion over the first substrate; and
a second substrate over the variable capacitor and the display portion,
wherein the variable capacitor includes a first electrode, a second electrode and a dielectric interposed therebetween,
wherein the first circuit reads a capacitance change of the variable capacitor,
wherein the second circuit controls the display portion based on the capacitance change,
wherein a first terminal of the sense amplifier is electrically connected to the variable capacitor and the switch, and
wherein a reference voltage is applied to a second terminal of the sense amplifier.

2. The semiconductor device according to claim 1,
wherein the first circuit is a read-out circuit, and
wherein the second circuit is a controller circuit including a central processing unit, a random access memory, an image processing circuit and an interface circuit.

3. The semiconductor device according to claim 1, wherein the first substrate includes a glass or a plastic.

4. The semiconductor device according to claim 1, wherein the capacitance change depends on a shape of the dielectric.

5. A semiconductor device comprising:
a substrate;
a first circuit over the substrate, the first circuit comprising a sense amplifier and a switch;
a second circuit over the substrate;
a variable capacitor over the first circuit and the second circuit; and
a display portion over the substrate,
wherein the variable capacitor includes a first electrode, a second electrode and a dielectric interposed therebetween,
wherein the first circuit reads a capacitance change of the variable capacitor,
wherein the second circuit controls the display portion based on the capacitance change,
wherein a first terminal of the sense amplifier is electrically connected to the variable capacitor and the switch, and
wherein a reference voltage is applied to a second terminal of the sense amplifier.

6. The semiconductor device according to claim 5,
wherein the first circuit is a read-out circuit, and
wherein the second circuit is a controller circuit including a central processing unit, a random access memory, an image processing circuit and an interface circuit.

7. The semiconductor device according to claim 5, wherein the substrate includes a glass or a plastic.

8. The semiconductor device according to claim 5, wherein the capacitance change depends on a shape of the dielectric.

9. A semiconductor device comprising:
a substrate;
a first circuit over the substrate, the first circuit comprising a sense amplifier and a switch;
a second circuit over the substrate;
a variable capacitor over the first circuit and the second circuit; and
a display portion over the substrate,
wherein the first circuit reads a capacitance change of the variable capacitor,
wherein the second circuit controls the display portion based on the capacitance change,
wherein a first terminal of the sense amplifier is electrically connected to the variable capacitor and the switch, and
wherein a reference voltage is applied to a second terminal of the sense amplifier.

10. The semiconductor device according to claim 9,
wherein the first circuit is a read-out circuit, and
wherein the second circuit is a controller circuit including a central processing unit, a random access memory, an image processing circuit and an interface circuit.

11. The semiconductor device according to claim 9, wherein the substrate includes a glass or a plastic.

12. A semiconductor device comprising:
a first substrate;
a first circuit over the first substrate, the first circuit comprising a sense amplifier and a switch;
a second circuit over the first substrate;
a variable capacitor over the first circuit and the second circuit;
a display portion over the first substrate; and
a second substrate over the variable capacitor and the display portion,
wherein the first circuit reads a capacitance change of the variable capacitor,
wherein the second circuit controls the display portion based on the capacitance change,
wherein a first terminal of the sense amplifier is electrically connected to the variable capacitor and the switch, and
wherein a reference voltage is applied to a second terminal of the sense amplifier.

13. The semiconductor device according to claim 12,
wherein the first circuit is a read-out circuit, and
wherein the second circuit is a controller circuit including a central processing unit, a random access memory, an image processing circuit and an interface circuit.

14. The semiconductor device according to claim 12, wherein the first substrate includes a glass or a plastic.

* * * * *

UNITED STATES PATENT AND TRADEMARK OFFICE
CERTIFICATE OF CORRECTION

| | | |
|---|---|---|
| PATENT NO. | : 8,384,657 B2 | Page 1 of 1 |
| APPLICATION NO. | : 13/367634 | |
| DATED | : February 26, 2013 | |
| INVENTOR(S) | : Kiyoshi Kato et al. | |

It is certified that error appears in the above-identified patent and that said Letters Patent is hereby corrected as shown below:

On the title page, at item (73), "Semicondcutor" should be --Semiconductor--.

Signed and Sealed this
Seventh Day of May, 2013

Teresa Stanek Rea
*Acting Director of the United States Patent and Trademark Office*